United States Patent [19]

Tubbs

[11] 4,184,208
[45] Jan. 15, 1980

[54] PSEUDO-STATIC SEMICONDUCTOR MEMORY CELL

[75] Inventor: Graham S. Tubbs, Houston, Tex.

[73] Assignee: Texas Instruments Incorporated, Dallas, Tex.

[21] Appl. No.: 925,916

[22] Filed: Jul. 19, 1978

[51] Int. Cl.² ............................................. G11C 11/40
[52] U.S. Cl. .................................... 365/203; 365/154; 365/222; 307/238
[58] Field of Search ............... 365/154, 182, 202, 203, 365/222; 307/238, 279

[56] References Cited

U.S. PATENT DOCUMENTS

| 3,949,383 | 4/1976 | Askin | 365/203 |
|---|---|---|---|
| 3,949,385 | 4/1976 | Sonoda | 365/203 |
| 4,122,541 | 10/1978 | Uchida | 365/154 |

Primary Examiner—Terrell W. Fears
Attorney, Agent, or Firm—John G. Graham

[57] ABSTRACT

An MOS memory cell of the pseudo static type employs a pair of cross-coupled driver transistors forming a bistable circuit, with load resistors replaced by a pair of series transistors connecting storage nodes to a supply voltage. The storage nodes are connected to complimentary data lines by a pair of coupling transistors controlled by a word address. The series transistors are turned on in sequence, for refresh, so an intermediate node is charged during a first phase and discharged into the storage nodes during the second phase. The series transistors are not used for read or write operations.

10 Claims, 2 Drawing Figures

PSEUDO-STATIC SEMICONDUCTOR MEMORY CELL

RELATED CASES

The subject matter of this application is related to that disclosed in copending U.S. applications Ser. No. 925,891, Ser. No. 925,892, and Ser. No. 925,893, filed herewith and assigned to Texas Instruments.

BACKGROUND OF THE INVENTION

This invention relates to semiconductor memory devices, and more particularly to an improved static type, random access, read/write memory.

For use as memory in small minicomputers and microprocessor systems, static semiconductor memory has an advantage compared to dynamic memory in that static does not require refresh. Dynamic MOS RAMs employ one-transistor cells compared to six transistor cells in conventional static RAMs, so the dynamic devices are much lower in cost because higher densities are achieved on smaller bar sizes. Unfortunately, the storage capacitors in dynamic cells leak charge and the data must be periodically refreshed by adressing each row of a memory array. In large memory systems, the circuitry required for refresh is small in proportion, but in the small memory associated with microcomputers, particularly on-chip registers, the refresh control circuitry is a significant portion of the system cost, so static type RAM cells must be used. Previous attempts to reduce the cell size in pseudo static or self refresh cells to make them more suitable for microcomputer devices include the following patents or applications, all assigned to Texas Instruments:

U.S. Pat. No. 3,955,181 issued to Joseph H. Raymond, Jr.

Ser. No. 671,252, filed May 28, 1976 by G. R. Mohan Rao

Ser. No. 727,116, filed Sept. 27, 1976 by Rao et. al.

Ser. No. 762,916, filed Jan. 27, 1977 by David J. McElroy

It is a principal object of this invention to provide improved memory devices made in a semiconductor integrated circuits. Another object is to provide an improved "static" or self refresh type MOS memory device, particularly a memory device of small cell size. An additional object is to provide small area pseudo static or self refresh memory elements in semiconductor integrated circuits which may be incorporated into microcomputer devices.

SUMMARY OF THE INVENTION

In accordance with an embodiment of this invention, an MOS memory cell of the pseudo static type employs a pair of cross-coupled driver transistors forming a bistable circuit, with load resistors replaced by a pair of series transistors connecting storage nodes to supply voltage. The storage nodes are connected to complementary data lines by a pair of coupling transistors controlled by a word address. The series transistors are turned on in sequence, for refresh, so an intermediate node is charged during a first phase and discharged into the storage nodes during the second phase. The series transistors are not needed for read or write operations.

BRIEF DESCRIPTION OF THE DRAWINGS

The novel features believed characteristic of the invention are set forth in the appended claims; the invention itself, however, as well as other features and advantages thereof, will best be understood by reference to the following detailed description of a particular embodiment, read in conjunction with the accompanying drawings, wherein:

DETAILED DESCRIPTION OF SPECIFIC EMBODIMENT

Figure 1:
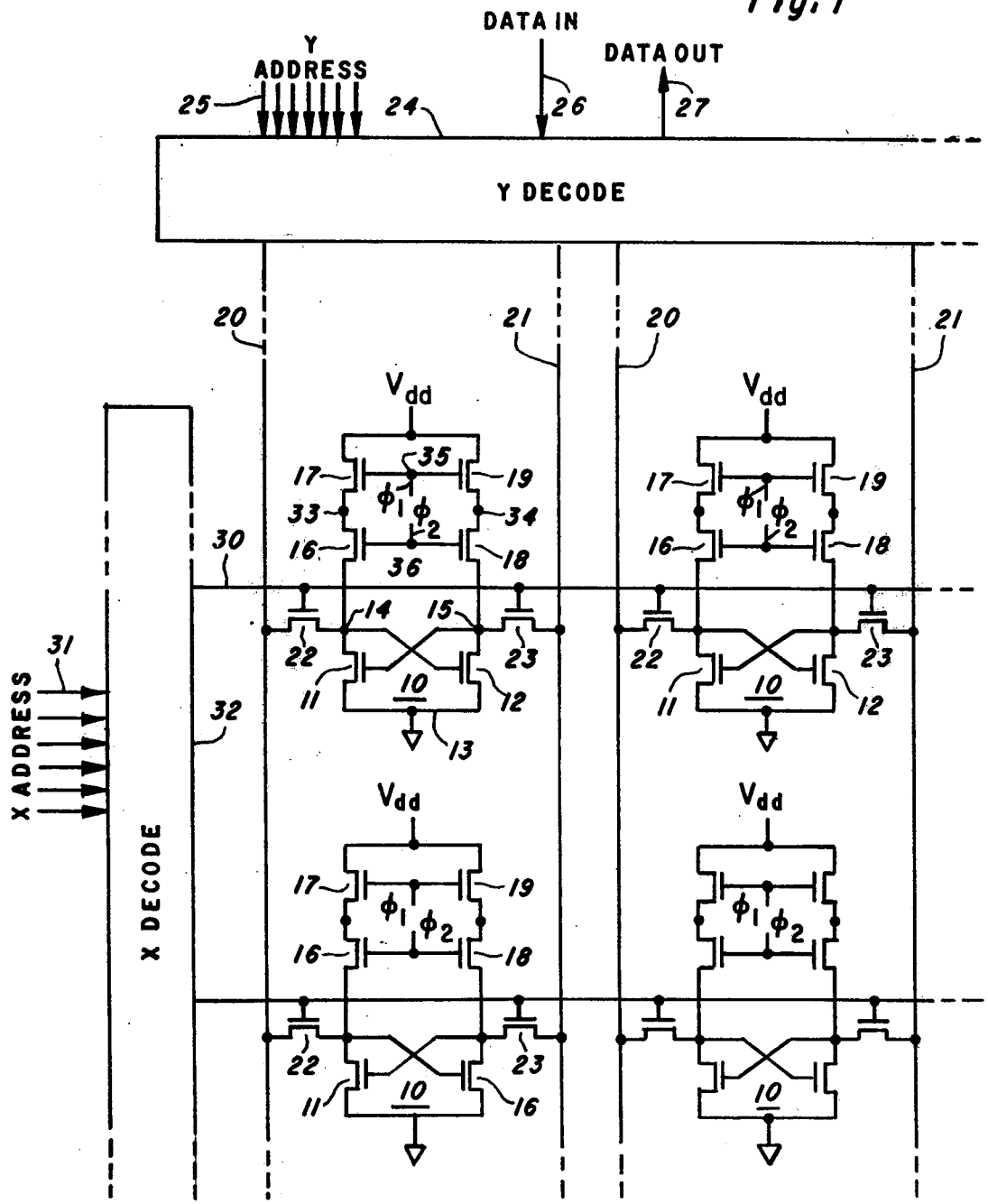
FIG. 1 is an electrical schematic diagram of an array of memory cells according to the invention.

Referring to FIG. 1, there is shown a part of an array of memory cells 10 constructed according to the invention. Each cell 10 includes a pair of driver transistors 11 and 12 which have a common source region 13 connected to ground or Vss. The drain 14 or 15 of each of the driver transistors is connected to the gate of the opposite transistor, providing a cross coupled bistable circuit. No load resistors of the conventional type are used. A pair of series transistors 16 and 17 connect the drain 14 of the driver transistor 11 to a voltage supply and likewise a pair of series transistors 18 and 19 connect the drain 15 of the driver transistor 12 to the supply in each cell 10. A pair of data and data bar lines 20 and 21 are connected to the nodes 14 and 15 by coupling transistors 22 and 23. The lines 20 and 21 are connected to a Y decoder 24 which selects one column, i.e., one of the pairs of lines 20 and 21, in accordance with a Y address applied to Y address inputs 25. One of the D or $\overline{D}$ lines 20 or 21 will go to a logic 1 and the other to 0, in the selected pair, according to whether a 1 or a 0 is applied to an input 26 for write operations. For read, a binary 1 or 0 is applied to the data out line 27 depending upon which one of the selected D or $\overline{D}$ lines goes to 1. The gates of the transistors 22 and 23 are connected to an x or row line 30. For read or write, one row line is taken to a voltage which will turn on the transistors 22 and 23, depending upon an address on an input 31 to a row decoder 32; the non-selected row lines will be held at Vss. For a 64×64 array, for example, there would be sixty-four of the row lines 30 and sixty-four pairs of the column or data lines 20 and 21.

Figure 2:
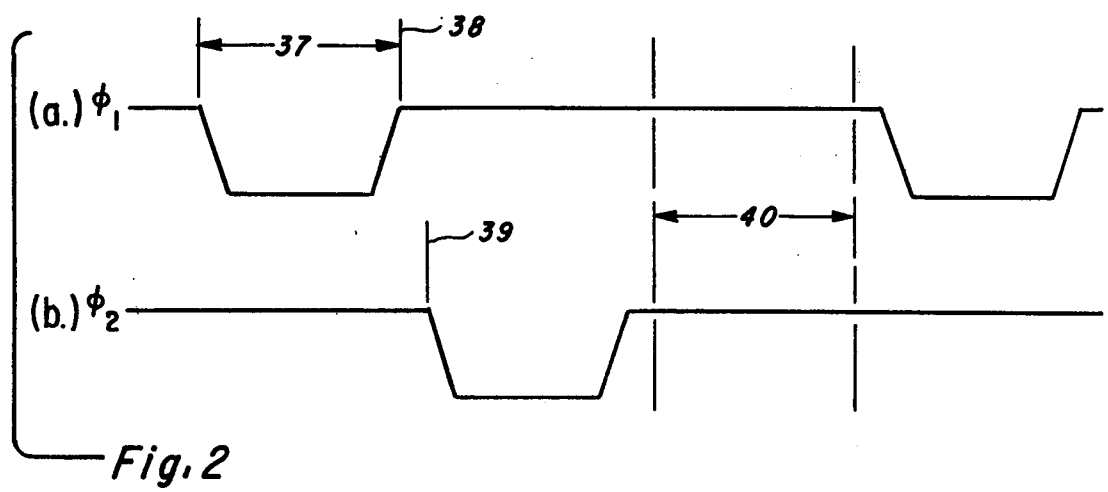
FIGS. 2a-2b are graphic representations of voltage vs. time for the voltage appearing at various points in the cell array of FIG. 1.

In refresh operations, nodes 33 and 34 between the series transistors are precharged to near −Vdd through transistors 17 and 19 by a clock $\Phi 1$ on line 35 as seen in FIG. 2a. The transistors 16 and 18 in each cell have a $\Phi 2$ clock applied to the gates by lines 36, $\Phi 2$ being shown in FIG. 2b.

An important feature of the invention is that there are no load resistors and no static current flow in either driver transistor for standby operations. The data and data bar lines 20 and 21 are not used or addressed for refresh. The nodes 33 and 34 are precharged to Vdd during a time period 37 during each refresh cycle when $\Phi 1$ is at −Vdd. At this same time, all of the transistors 17 and 19 are on due to the $\Phi 1$ clock, so the nodes 34 and 35 between the two series transistors charge to about −(Vdd−Vt). Beginning at time 38 all of the transistors 17 and 19 turn off as $\Phi 1$ goes to Vss so the nodes 34 and 35 are isolated. Then $\Phi 2$ goes to −Vdd at time 39 and charge is supplied to the drains 14 and 15; one side will dissipate this charge to ground through the conducting one of the driver transistors 11 or 12 in each cell 10, while the other will store the charge on the gate of the driver transistor. This maintains the stored one or zero until the next refresh cycle.

Read or write operations occur during a time period 40 when neither of the refresh clocks Φ1 and Φ2 are active. The data and data bar lines 20 and 21 act as the supply during write, so the transistors 16–19 are not needed. During write, the voltage on the nodes 14 and 15 is sensed in transistors 22 and 23 and lines 20 and 21, in conventional manner.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is therefore contemplated that the appended claims will cover any such modifications of embodiments as fall within the true scope of the invention.

What is claimed is:

1. A memory cell comprising a pair of driver transistors, first and second pairs of series transistors, and a pair of coupling transistors, each of the transistors having a current path and a control electrode, a pair of storage nodes, a pair of complementary data lines, each of coupling transistors having its current path connected in series between one of the data lines and one of the storage nodes, the current paths of the series transistors connecting the storage nodes to a voltage source via a pair of intermediate nodes, means for precharging the intermediate nodes during a first time period by applying operating voltage to the control electrodes of a first of the transistors in each of the pairs of series transistors, and means for applying operating voltage to the control electrodes of the other of the transistors in each of the pairs of series transistors during a second time period after said first time period in each refresh cycle.

2. A memory cell according to claim 1 wherein the first of the series transistors in each pair has its current path adjacent the voltage source and the other of the series transistors in each pair has its current path adjacent the storage node.

3. A memory cell according to claim 2 wherein conductive means applies an operating voltage to the control electrodes of said coupling transistors during a later time period for read or write operations.

4. A memory cell according to claim 2 wherein a node between the current paths of the series transistors in each pair is charged during the first time period.

5. A memory cell according to claim 4 wherein said transistors are insulated gate field effect transistors, the current paths are source-to-drain paths, and the control electrodes are gates.

6. A memory cell according to claim 5 wherein the drain of each of the driver transistors is connected to the gate of the other to provide a cross coupled bistable circuit.

7. A memory cell according to claim 6 wherein a plurality of identical cells is provided in an array of rows and columns.

8. A memory cell according to claim 7 wherein the conductive means provides a row address line for a plurality of cells in a row.

9. A memory cell according to claim 8 wherein a plurality of pairs of said data lines further provide the column lines for the array of cells.

10. A memory cell according to claim 9 wherein means are provided for selecting one row and one column for read or write operations, and all cells are refreshed at a time other than the time of a read or write operation.

* * * * *